(12) United States Patent
Dietze

(10) Patent No.: US 12,087,922 B2
(45) Date of Patent: Sep. 10, 2024

(54) ENERGY STORAGE DEVICE, MOTOR VEHICLE OR MONITORING SYSTEM COMPRISING SUCH AN ENERGY STORAGE DEVICE, AND USE OF SUCH AN ENERGY STORAGE DEVICE

(71) Applicant: LITEWERKS GmbH, Constance (DE)

(72) Inventor: Frederic Dietze, Allensbach (DE)

(73) Assignee: LITEWERKS GMBH, Constance (DE)

( * ) Notice: Subject to any disclaimer, the term of this patent is extended or adjusted under 35 U.S.C. 154(b) by 1064 days.

(21) Appl. No.: 16/961,474

(22) PCT Filed: Jan. 11, 2019

(86) PCT No.: PCT/EP2019/050687
§ 371 (c)(1),
(2) Date: Jul. 10, 2020

(87) PCT Pub. No.: WO2019/138072
PCT Pub. Date: Jul. 18, 2019

(65) Prior Publication Data
US 2021/0098831 A1    Apr. 1, 2021

(30) Foreign Application Priority Data
Jan. 11, 2018    (DE) .................... 20 2018 100 148.5

(51) Int. Cl.
*H01M 10/48*    (2006.01)
*F02N 11/08*    (2006.01)
(Continued)

(52) U.S. Cl.
CPC ......... *H01M 10/48* (2013.01); *F02N 11/0862* (2013.01); *G01R 31/396* (2019.01);
(Continued)

(58) Field of Classification Search
CPC ......... H01M 10/48; H01M 2010/4278; H01M 2220/20; H01M 2200/00; F02N 11/0862;
(Continued)

(56) References Cited

U.S. PATENT DOCUMENTS

| 10,224,579 B2 * | 3/2019 | Christensen ...... H01M 10/4257 |
| 2007/0001616 A1 * | 1/2007 | Puccetti ............. F02N 11/0866 |
| | | 315/169.3 |

(Continued)

FOREIGN PATENT DOCUMENTS

| DE | 102011013182 A1 | 9/2012 |
| DE | 102011086495 A1 | 5/2013 |

(Continued)

OTHER PUBLICATIONS

Battery manual (Year: 2018).*

(Continued)

*Primary Examiner* — Mohammad K Islam
(74) *Attorney, Agent, or Firm* — Harness, Dickey & Pierce, P.L.C.

(57) ABSTRACT

Energy storage device, in particular for the starter of an internal combustion engine, includes at least one energy storage element, a data generating unit for acquiring operating parameters of the energy storage device and generating corresponding data, at least one separating device for reversibly separating an electrically conductive connection between the energy storage element and a power source and/or an electrically conductive connection between the energy storage element and a power receiver, and a data transmitting unit for transmitting data between the data generating unit and a data input/output device and between the data input/output device and the separating device, where the separating device is actuated depending on data (Continued)

which is transmitted from the data generating unit and/or the data transmitting unit to the separating device.

12 Claims, 3 Drawing Sheets

(51) Int. Cl.
    *G01R 31/396*    (2019.01)
    *H01M 10/42*     (2006.01)

(52) U.S. Cl.
    CPC .. *F02N 2200/062* (2013.01); *F02N 2200/064* (2013.01); *H01M 2010/4278* (2013.01); *H01M 2220/20* (2013.01)

(58) Field of Classification Search
    CPC ......... F02N 2200/062; F02N 2200/064; F02N 11/10; G01R 31/396; G01R 19/16542; Y02E 60/10
    See application file for complete search history.

(56) References Cited

U.S. PATENT DOCUMENTS

| | | | | |
|---|---|---|---|---|
| 2009/0278509 A1* | 11/2009 | Boyles | ................... | F02N 1/005 |
| | | | | 320/163 |
| 2015/0266558 A1* | 9/2015 | Biebach | ............. | H01M 50/317 |
| | | | | 429/54 |
| 2016/0011275 A1* | 1/2016 | Saito | ................... | F02N 11/0862 |
| | | | | 324/430 |
| 2017/0144562 A1* | 5/2017 | Thomas | ............ | H01M 10/4257 |
| 2019/0040832 A1* | 2/2019 | Namiki | ................ | G01R 31/367 |
| 2019/0198833 A1* | 6/2019 | Le | ........................... | B60L 58/20 |
| 2019/0221798 A1* | 7/2019 | Eisermann | .......... | H01M 50/522 |
| 2020/0083706 A1* | 3/2020 | Paskov | ..................... | H02J 7/00 |
| 2020/0158786 A1* | 5/2020 | Gupta | ................. | G01R 31/3646 |

FOREIGN PATENT DOCUMENTS

| | | |
|---|---|---|
| DE | 102012203585 A1 | 9/2013 |
| DE | 102013220609 A1 | 4/2015 |
| DE | 102014203919 A1 | 9/2015 |
| DE | 102014215033 A1 | 2/2016 |
| DE | 102015002080 A1 | 8/2016 |
| EP | 2645525 A2 | 10/2013 |

OTHER PUBLICATIONS

International Search Report PCT/ISA/210 for International Application No. PCT/EP2019/050687 Dated Apr. 12, 2019.

European Office Action dated Oct. 5, 2023 for corresponding European Patent Application No. 19700582.0 and its English-language translation.

\* cited by examiner

ENERGY STORAGE DEVICE, MOTOR VEHICLE OR MONITORING SYSTEM COMPRISING SUCH AN ENERGY STORAGE DEVICE, AND USE OF SUCH AN ENERGY STORAGE DEVICE

CROSS-REFERENCE TO RELATED APPLICATIONS

This application is a national phase under 35 U.S.C. § 371 of PCT International Application No. PCT/EP2019/050687 which has an International filing date of Jan. 11, 2019, which claims priority to German Patent Application No. 202018100148.5, filed Jan. 11, 2018, the entire contents of each of which are hereby incorporated by reference.

The present invention relates to an energy storage device, in particular for the starter of an internal combustion engine. The invention also relates to a motor vehicle or a monitoring system comprising such an energy storage device and the use of such an energy storage device It is known to monitor the operating state of lead-acid-based starter batteries, for example, using an electronic device on a battery terminal which communicates in real time with the control device of the respective vehicle. A large number of different values can be transmitted, in particular the temperature at the battery terminal, the voltage between the battery terminals, the current presently being drawn or the capacity. It is also known to monitor the state of charge of a starter battery using a stand-alone box which determines the current drawn or the present voltage. Monitoring systems of this kind for batteries can only be installed with considerable effort, are costly and offer only limited functionalities.

In contrast to lead acid-based starter batteries, starter batteries with lithium-based cells can be damaged if they are operated in the medium and/or long term above or below a certain voltage level. In field use, this can happen, for example, by consumers deep discharging them when the vehicle is stationary or by overcharging them due to an excessively high voltage regulator value of the alternator or by a failure of the voltage regulator of the alternator, respectively. Starter batteries with lithium-based cells therefore have increased monitoring demands to ensure long-term operational safety. Starter batteries based on LiFePO4 are also subject to increased demands for verifying individual states, in particular non-operating states.

Against this background, the object of the present invention is to provide an energy storage device which enables improved monitoring or extended monitoring functionality and/or inspection with only low costs and little installation effort. The object also involves specifying a monitoring system, a motor vehicle, the use of an energy storage device and a method for monitoring an energy storage device.

This object is satisfied with an energy storage device according to claim 1. Further configurations of the invention are disclosed in the respective dependent claims.

An energy storage device according to the invention is configured in particular for the starter of an internal combustion engine and comprises: at least one energy storage element, a data generating unit for acquiring operating parameters of the energy storage device and for generating corresponding data, at least one separating device for reversibly separating an electrically conductive connection between the energy storage element and a power source and/or an electrically conductive connection between the energy storage element and a power receiver, and a data transmitting unit for transmitting data between the data generating device and a data input/output device as well as between a data input/output device and the separating device, where the separating device is actuated depending on data which is transmitted from the data generating unit and/or the data transmitting unit to the separating device. Alternatively, the energy storage device according to the invention can also be used for storage applications, in particular in the voltage range from 12 to 48 V.

The at least one energy storage element can be monitored and/or inspected with little effort using an energy storage device configured in this manner. The monitoring and/or inspecting functionality can also be expanded with little effort by way of the data transmitting unit, can in particular be individually adapted to the respective case of application.

For example, the energy storage device according to the invention allows for the temperature of the energy storage element to be monitored continuously during operation, so that a so-called thermal runaway or sustained damage can be prevented with little effort, in particular by an additional safety functionality which is provided by the data transmission between the data transmitting unit and the data input/output device. It is possible to warn the user preferably in real time or to initiate a safety function such as shutting down the motor or initiate disconnecting or separating the energy storage device from consumers or power sources once the determined states are outside a target range. Operational safety is significantly increased over a purely acoustic warning to the user which can be missed or ignored.

As a result, the range of functions of the energy storage device is advantageously expanded, as a result of which, in particular, operational safety is improved and any testing and/or diagnostic processes are simplified. By reading out the operating states and acquiring certain operating parameters in real time while driving and using the data, for example, in the vehicle electronics, the motor of the vehicle can be shut down in the event of a fault determined or in the event of a short circuit. The development of fire or damage to the starter battery with lithium-based cells can thus be prevented. Finally, for example, the operating states or operating parameters can be read out and/or monitored with the data input/output device, such as a smartphone, or the on-board computer of the vehicle equipped with the energy storage device. For example, a user can receive a text message if the rechargeable battery is discharged or consumers are switched on while in a stationary state. The risk of deep discharge can thus be reduced and the lifespan extended, because the user can recharge the energy storage element early or start the respective motor vehicle.

It can also be advantageous to have the energy storage device comprise at least one of the following features:
- The energy storage device has a weight in the range from 0.5 to 5 kg, preferably in the range from 1 to 3 kg, preferentially 1.1 kg, 1.9 kg or 2.6 kg.
- The energy storage device generates a maximum discharge current in the range from 200 to 2000 A, preferentially in the range from 400 to 2000 A, preferentially 450 A, 750 A or 1050 A.
- The energy storage device has a capacity in the range from 30 to 1000 Wh, preferably in the range from 30 to 250 Wh, preferentially 99 Wh, 165 Wh or 231 Wh.
- The energy storage device has a nominal voltage in the range from 5 to 24 V, preferably in the range from 9 to 16 V, preferentially 13.2 V.
- The energy storage device has a maximum voltage in the range from 5 to 20 V, preferably in the range from 9 to 16 V, preferentially 15.2 V.

However, it can also be advantageous to have the energy storage element comprise at least one of the following features:

The energy storage element comprises one or more energy storage cells, preferably a battery cell, preferentially a secondary battery or accumulator cell or a cup cell.

The energy storage element comprises one or more lithium battery cells.

The energy storage element comprises one or more lithium iron phosphate battery cells.

The energy storage element is formed as a starter battery, preferably for feeding a starter of an internal combustion engine.

The energy storage element is formed as a starter battery for motor vehicles, in particular for the use in motor sports vehicles.

The energy storage element or at least one energy storage cell is formed to be cylindrical, cuboid or cube-shaped, where the positive terminal and the negative terminal are preferably formed at different ends of the energy storage element.

The energy storage element comprises an operating temperature range from −30° C. to +60° C., preferably from 0° C. to +40° C., preferentially from +15° C. to +25° C.

The energy storage element comprises a plurality of energy storage cells which are preferably connected in parallel and/or in series to one another.

The energy storage element comprises a plurality of energy storage cells which are connected in series to form a cell pack.

The energy storage element comprises a plurality of cell packs with energy storage cells connected in series, where the cell packs are connected in parallel to one another.

The energy storage element comprises exactly 12 energy storage cells, where 4 cells are preferably connected in series to form a cell pack and further preferably 3 cell packs are connected in parallel.

The energy storage element comprises exactly 20 energy storage cells, where 4 cells are preferably connected in series to form a cell pack and further preferably 5 cell packs are connected in parallel.

The energy storage element comprises exactly 28 energy storage cells, where 4 cells are preferably connected in series to form a cell pack and further preferably 7 cell packs are connected in parallel.

The energy storage element comprises exactly 20 energy storage cells, where 5 cells are preferably connected in series to form a cell pack and further preferably 4 cell packs are connected in parallel.

The energy storage element comprises exactly 40 energy storage cells, where 5 cells are preferably connected in series to form a cell pack and further preferably 8 cell packs are connected in parallel.

Lithium-based battery cells are characterized, inter alia, by the low development of heat during charging and a high power density. They are particularly advantageously suitable for use as rechargeable starter batteries. In combination with a monitoring device according to the invention, overall high operational safety with advantageous performance can be achieved. The pack-like arrangement of individual storage cells facilitates the assembly and transport as well as the circuitry and connection to the respective electronics.

It can be advantageous to have the separating device comprise at least one of the following features:

The separating device comprises at least one electronic switch for reversibly separating an electrically conductive connection between the energy storage element and a power source and/or an electrically conductive connection between the energy storage element and a power receiver, preferably at least one high-performance MOSFET-based switch, preferably at least one separate electronic switch for each energy storage cell or each group/series of energy storage cells of the energy storage element, particularly preferably one respective electronic switch for reversibly separating the respective energy storage cell or the respective group/series of energy storage cells from a power source and one electronic switch for reversibly separating the respective energy storage cell or the respective group/series of energy storage cells from a power receiver.

The separating device comprises a circuit board on which control electronics are implemented.

The separating device comprises at least one electrically conductive shaped member, for example a punched and/or bent part, e.g. made of copper or brass, for conducting a current to and/or from the energy storage element, preferably at least one electrically conductive shaped member for each energy storage cell or each group/series of energy storage cells of the energy storage element, in particular one respective electrically conductive shaped member for conducting a current from an electronic switch according to feature a to the respective energy storage cell or the respective group/series of energy storage cells and one respective electrically conductive shaped member for conducting a current from the respective energy storage cell or the respective group/series of energy storage cells to an electronic switch according to feature a.

The separating device comprises a base plate, preferably made of fiber-reinforced plastic, on which the circuit board according to feature b and the at least one shaped member according to feature c are arranged together.

At least one, several or each switch(es) according to feature a can be actuated depending on the first data signal and/or the second data signal and/or the third data signal and/or the fourth data signal of the data generating unit, where the respective electronic switch (3d, 3e) and the respective data signal preferably pertain to the same energy storage cell or the same group/series of energy storage cells of the energy storage element.

At least one, several or each switch(es) according to feature a can be actuated depending on a data signal transmitted from the data transmitting unit to the separating device.

At least one, several or each switch(es) according to feature a can be actuated depending on a data signal transmitted from the data display unit to the separating device.

The separating device is arranged on the cover of a casing of the energy storage device or is arranged in a corresponding receptacle in the cover of the casing of the energy storage device or is adhesively bonded or screwed from the inside to the cover of the casing of the energy storage device.

The separating device is configured to interrupt an electrically conductive connection between the energy storage element and a power receiver, for example in the form of a starter for an internal combustion engine, when a data signal is received from the data generating unit which indicates an excessively low temperature of the energy storage element or an energy storage cell or a group/series of energy storage cells of the energy storage element and to establish an electrically conductive connection between the energy storage element or the energy storage cell or the group/series of energy storage cells and another power receiver.

The separating device is configured to establish an electrically conductive connection between the energy storage element and a power receiver, for example in the form of a starter for an internal combustion engine, when a data signal is received from the data generating unit which indicates the correct temperature of the energy storage element or an energy storage cell or a group/series of energy storage cells of the energy storage element.

The separating device is configured to interrupt an electrically conductive connection between the energy storage element and a power receiver, for example in the form of a starter for an internal combustion engine, when a first data signal is received from the data transmitting unit, and to establish it when a second data signal is received from the data transmitting unit.

The separating device is configured to restore the electrically conductive connection after a separation of the electrically conductive connection when a data signal is received from the data transmitting unit or when a data signal is received which indicates the connection of a charger or the application of an initial voltage between the terminals.

It can be expedient to have the data generating unit comprise at least one of the following features:

The data generating unit is configured to acquire at least one of the following operating parameters of the energy storage device and to generate corresponding data:

The electrical voltage of the energy storage element, preferably the electrical voltage of an individual energy storage cell or a group/series of energy storage cells of the energy storage element, preferably the electrical voltage of each energy storage cell or each group/series of energy storage cells of the energy storage element.

The electrical current of the energy storage element, preferably the electrical current of an individual energy storage cell or a group/series of energy storage cells of the energy storage element, preferably the electrical current of each energy storage cell or each group/series of energy storage cells of the energy storage element.

The temperature of the energy storage element, preferably the temperature of an individual energy storage cell or a group/series of energy storage cells of the energy storage element, preferably the temperature of each energy storage cell or each group/series of energy storage cells of the energy storage element.

The pressure within or in the environment of the energy storage device, in particular within a casing of the energy storage device.

The moisture within or in the environment of the energy storage device, in particular within a casing of the energy storage device.

The gas composition within or in the environment of the energy storage device, in particular within a casing of the energy storage device.

Acceleration of the energy storage device (G-sensor).

Location of the energy storage device (GPS sensor).

The data generating unit is configured to generate a first data signal if at least one of the operating parameters lies within a corresponding range of operating parameters, where the corresponding range of operating parameters is preferably adjustable, preferably by way of the data input/output device, so that a signal can be sent to the separating device in order to immediately interrupt the power supply, inter alia, in the event of a strong deceleration (crash/accident) of the vehicle.

The data generating unit is configured to generate a second data signal if at least one of the operating parameters lies outside a corresponding range of operating parameters, where the corresponding range of operating parameters is preferably adjustable, preferably by way of the data input/output device.

The data generating unit is configured to generate a third data signal if at least one of the operating parameters lies below a corresponding range of operating parameters, where the corresponding range of operating parameters is preferably adjustable, preferably by way of the data input/output device.

The data generating unit is configured to generate a fourth data signal if at least one of the operating parameters lies above a corresponding value for operating parameters, where the corresponding value for operating parameters is preferably adjustable, preferably by way of the data input/output device.

The data generating unit is configured to monitor the operating state of the energy storage element, in particular, for real-time monitoring.

The data generating unit is configured to inspect individual states of the energy storage element, preferably to inspect a non-operating state, the delivery state, a state for diagnostic purposes and/or a state in which the energy storage device is separated from a power source and/or a power receiver.

The data generating unit is configured to detect fault states of the energy storage element, preferably configured to acquire critical voltage, current, temperature, pressure, moisture and/or gas values, further preferably to acquire respective maximum and/or minimum values.

The data generating unit is configured to store acquired data, in particular acquired electrical voltages, currents, temperatures, pressures, moisture values, gas values, fault conditions, maximum and/or minimum values.

The data generating unit is configured to transmit acquired and/or stored data by way of the communication device.

The data generating unit comprises a sensor for detecting the electrical voltage of the energy storage element and/or a device for detecting electrical currents, preferably a current sensor or shunt, and/or a temperature sensor for detecting the temperature of the energy storage element and/or a pressure sensor and/or a moisture sensor and/or a gas sensor, preferably for determining the change in the cell chemistry of the energy storage element and/or a location sensor, preferably a GPS sensor.

The data generating unit comprises a memory unit for storing acquired data.

The data generating unit comprises a data processing device for processing acquired and/or stored data.

The data generating unit is configured to transmit acquired and/or stored data to a vehicle control device.

The data generating unit is configured to transmit acquired and/or stored data by way of the communication device to a stationary or mobile terminal, in particular a smartphone, where information based on the data can be displayed, preferably graphically and/or in text form, in a user program installed on the terminal.

The data generating unit is configured to transmit acquired and/or stored data to a stationary or mobile monitoring system, preferably having a display.

The data communicated via the data generating unit can be stored on a customer server, which enables extended customer service.

The data communicated via the data generating unit can serve as a database for remote maintenance or can be used for preventive fault detection (Internet of Things).

It can prove to be practical to have the data transmitting unit comprise at least one of the following features:

The data transmitting unit is configured for contactless signal and/or energy transmission.

The data transmitting unit is configured for contactless communication, preferably for contactless data transmission.

The data transmitting unit is configured to send and/or receive data.

The data transmitting unit is configured to feed and/or receive electrical energy.

The data transmitting unit is configured to transmit data by way of radio technology and/or light waves.

The data transmitting unit is configured to transmit data by way of RFID technology, near field communication (NFC), Bluetooth and/or wireless LAN.

The data transmitting unit is configured as an antenna for near field communication (NFC), in particular as an NFC tag.

The data transmitting unit is configured to transmit signals, data and/or energy by way of induction and/or magnetic coupling.

The data transmitting unit is configured as a Reed switch.

The data transmitting unit is configured for secure data exchange, in particular for cryptographically secured data exchange.

The data transmitting unit is configured for active-passive and/or for active-active (peer-to-peer) communication.

The data transmitting unit is configured for communication via CAN or LIN bus.

For example, it is possible to read out all the operating states of the energy storage element fitted via a smartphone with a Bluetooth interface or a card reader with Bluetooth and thus obtain conclusions about the state or the previous use and/or enter switching states of the monitoring device by way of an input device with a Bluetooth interface, for example, to initiate a reset. Reading out can be advantageous, for example, in the event of a warranty claim or damage, since misuse can then be identified in good time or clearly demonstrated without great effort. In addition, the state of the energy storage element can be determined without opening the energy storage device or establishing any laborious connection of a respective diagnostics device. There is no need for costly plug connections.

However, it can also be useful to have the energy storage element be accommodated in a casing, where the data generating unit and/or the data transmitting unit are preferably also arranged within or on the casing, where pressure equalization in the casing is preferably realized by way of a membrane integrated into the casing cover, where the membrane is preferably configured such that it opens or disintegrates at a temperature above 100° C. and thus additionally increases the air throughput. This can ensure a compact structure which facilitates the transportation and assembly or installation and increases operational safety.

It can be useful to have the data generating unit be arranged between the energy storage element and a casing wall, preferably between the energy storage element and the one cover of the casing and/or, where the casing comprises a cover, on the inner side of which the data transmitting unit is arranged. As a result, the overall structure can be compact. At the same time, this enables the reliable attachment of the data generating unit and/or the data transmitting unit.

It can prove advantageous to have the separating device be formed separately from the energy storage element and/or be arranged spaced from the energy storage element and/or, where the separating device is integrated into the energy storage device, is preferably arranged within a casing of the energy storage device. Such an energy storage device can be used, for example, to initiate the separation of the energy storage device when the voltages are too high or too low, so that damage can be prevented. A separation can be, for example, automated or initiated by user input. This further improves operational safety. Such a configuration can reduce the risk of theft of a vehicle with little effort.

in particular, this enables the energy storage device or the energy storage element contained therein and thus the vehicle to be deactivated from a distance, similar to an immobilizer device. If the energy storage device is fed by the automotive alternator via power electronics, then the separating device configured as power electronics can separate it when necessary. According to the invention, the communication or the signal is transmitted via the data transmitting unit. Such power electronics can be configured to transmit high currents over a longer period of time, e.g. 200 A over >10 sec, or peak currents over a very short period of time, e.g. 1000 A over <1 sec.

According to a further embodiment, the separating device is formed separately from the energy storage element and/or is arranged spaced from the energy storage element. The freedom of design for the assembly of the different components in or on a vehicle is thus increased. The separating device can also be integrated into the energy storage device, preferably arranged within a casing of the energy storage device, thereby ensuring an overall compact structure.

A separating device, in particular for separating an energy storage device from a power source and/or a power receiver, can comprise power electronics and can be configured to interact with a data generating unit of an energy storage device and/or a stationary or mobile terminal device in order to perform a separation of the energy storage device in dependence of received and/or transmitted data.

A further aspect of the invention relates to a motor vehicle, in particular for motor sports, with an internal combustion engine, a starter as well as an energy storage device according to one of the preceding configurations. Such a vehicle exhibits increased operational safety and/or improved theft protection.

A further aspect of the present invention relates to a monitoring system with at least one energy storage device according to one of the preceding configurations and a data input/output device for data exchange with the data generating unit of the energy storage device. With such a monitoring system, any safety functionalities can advantageously be provided via the data input/output device. For example, the respective operating state can be actively monitored by a user and/or by trained monitoring staff using the data input/output device. If any fault states are identified, safety measures can be actively initiated. For example, the user receives a message on his smartphone once the vehicle has moved or the alarm system triggers, or as soon as electricity is drawn, and the energy storage device can then be deactivated remotely or autonomously by the system during the starting process without prior activation.

A further aspect of the present invention relates to the use of an energy storage device according to one of the preceding configurations as an energy storage device for motor vehicles, preferably in motor sports. Such an energy storage device is particularly advantageously suitable for use in motor sports, in particular due to the high power density and the improved operational safety.

A further aspect of the present invention relates to a method for monitoring an energy storage device in which at least one operating parameter of the energy storage device is acquired by way of a data generating unit and corresponding data is generated which is transmitted to a data input/output device by a data transmitting unit. Such a method advantageously allows the energy storage device to be monitored and/or inspected with little effort. Due to the data transmission between the data generating unit and external peripherals, the monitoring and/or inspecting functionality can also be expanded with little effort and, in particular, adapted individually to the respective case of application.

The invention is not restricted to the embodiments expressly described. Further advantageous embodiments arise from combining the features disclosed in the claims, the specification, and the drawings. The invention shall be explained below with reference to a drawing showing embodiments.

Terms and Definitions

The data acquiring unit within the meaning of the invention comprises, for example, at least one sensor for detecting at least one operating parameter of the energy storage device and for generating corresponding data, preferably in digital form.

The data transmitting unit within the meaning of the invention comprises, for example, a data interface. Data transmission can take place by wire or wirelessly (e.g. wireless LAN or Bluetooth).

The power source within the meaning of the invention comprises, for example, the alternator of a vehicle, in particular the alternator of the vehicle equipped with the energy storage device. The power source is not part of the energy storage device.

The power receiver within the meaning of the invention is, for example, the starter of an internal combustion engine of a vehicle, in particular the starter of the internal combustion engine of the vehicle equipped with the energy storage device. Other line receivers [SIC power receivers] are possibly consumers such as on-board electronics or integrated resistors for the selective energy withdrawal with the aim of increasing the temperature of the energy storage device or individual energy storage cells. The power receiver is not part of the energy storage device.

The data input/output device within the meaning of the invention is, for example, a smartphone, a tablet or an on-board computer of a vehicle with a screen and input elements, in particular the on-board computer of the vehicle equipped with the energy storage device.

The separating device within the meaning of the invention is, for example, a plate-shaped arrangement with a circuit board, MOSFETs, and several shaped members, as shown in the figures.

DETAILED DESCRIPTION OF THE PREFERRED EMBODIMENTS

Figure 1:
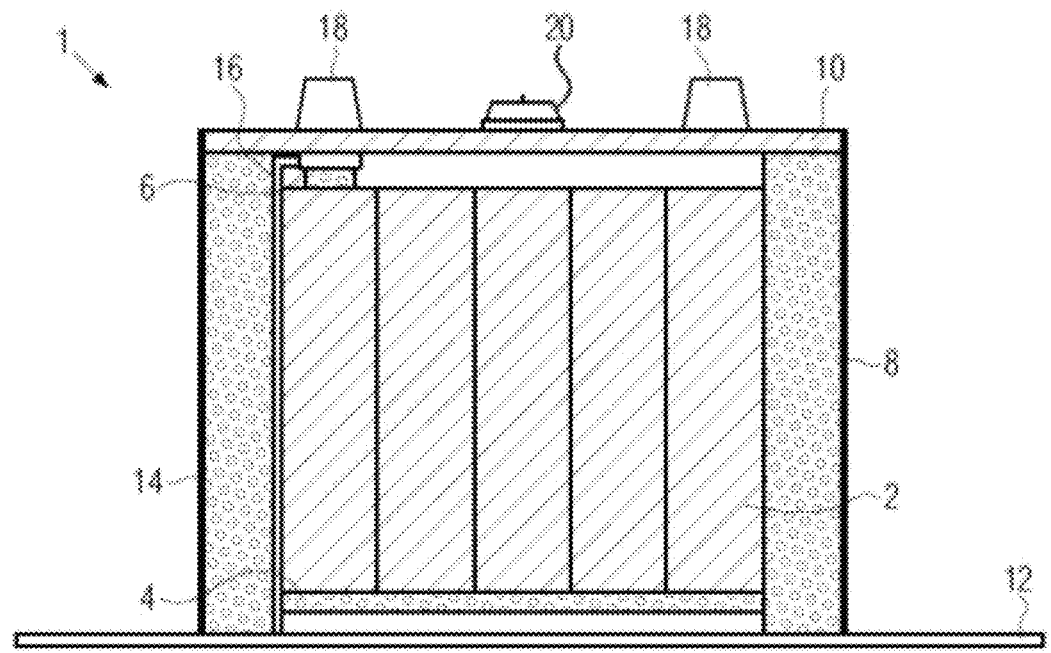
FIG. 1 shows a schematic cross-sectional view of an energy storage device according to one embodiment of the present invention.

FIG. 1 shows a schematic cross-sectional view of an energy storage device 1 according to one embodiment of the present invention. Energy storage device 1 is configured in particular to feed a starter of an internal combustion engine. Energy storage device 1 comprises at least one energy storage element 2, a data generating unit 4 for acquiring operating parameters of energy storage device 1, in particular of the energy storage element of energy storage device 1, and generating corresponding data, preferably in digital form, and a data transmitting unit 6 for transmitting data between data generating unit 4 and an external data input/output device 9 in the form of a smartphone or an external signal transmitter (switch/posh button) or though the vehicle communication system via CAN or LIN bus, via which, for example, a sufficiently reliable redundant communication or shutdown can be ensured.

Furthermore, energy storage device 1 comprises a casing 8 which is preferably made of CFRP. The casing can also be equipped with a cover 10. At least one energy storage element 2, data generating unit 4, as well as data transmitting unit 6 are preferably arranged within casing 8 which is closed by cover 10. Casing 8 can also comprise a base plate 12 which can likewise be made of CFRP. Base plate 12 can protrude beyond the casing side walls. The casing interior is equipped with a foam 14 in which energy storage element 2 is received.

A plurality of energy storage elements 2 are preferably provided, which are more preferably configured as lithium battery cells. Data generating unit 4 is configured, for example, as electronics in the form of a circuit board which is arranged between energy storage elements 2 and a casing base, preferably between the casing base and a foam layer beneath energy storage elements 2. Data transmitting unit 6 is preferably configured as an NFC antenna and arranged on the inner side of cover 10. Data generating unit 4 and data transmitting unit 6 can be connected to one another by a cable arrangement 16.

Figure 2:
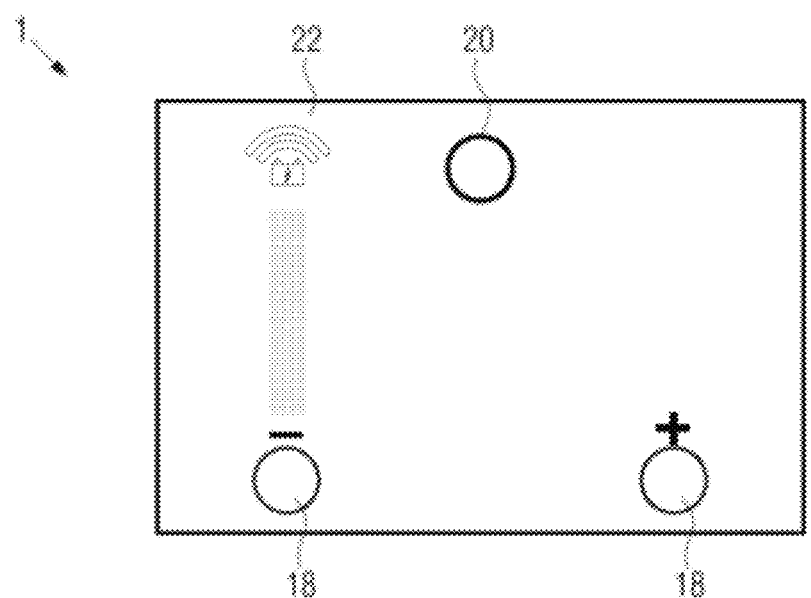
FIG. 2 shows a schematic top view of an energy storage device according to one embodiment of the present invention.

As can be seen from FIGS. 1 and 2, energy storage device 1 comprises terminals 18 via which an electrical connection of energy storage elements 2 to a power source and/or to a power receiver can be established. Terminals 18 are arranged on an outer side of cover 10. Cover 10 also comprises a pressure compensation valve 20 with which a possibly occurring overpressure in the interior of the casing can be compensated. In addition, any excess pressure caused by the battery cells gassing out in the event of an overload can be released effectively and in a controlled manner to effectively prevent an explosive bursting of the casing. The pressure equalization is realized by a membrane which is integrated into the casing cover. The membrane is configured in such a way that it disintegrates at an elevated temperature >100° C. and thus additionally increases the air throughput.

Arranged on the outer side of cover 10 can furthermore be a symbol which refers to data transmitting unit 6. In particular, symbol 22 can indicate the technology of the respective data transmitting unit 6, for example, symbolize the NFC technology.

Figure 3:
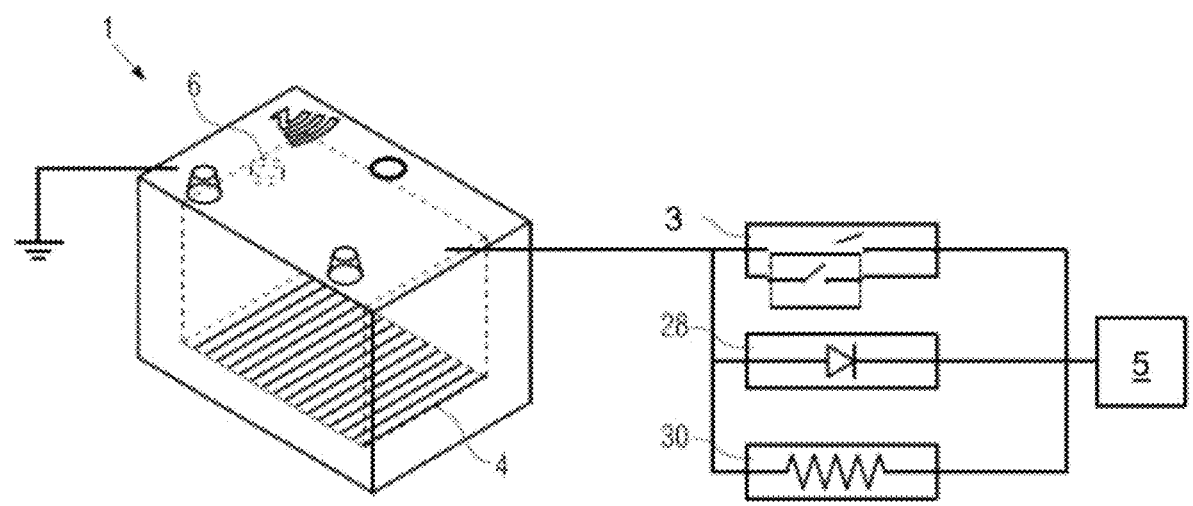
FIG. 3 shows a schematic representation of an energy storage device with an alternator of a motor vehicle connected thereto according to one embodiment of the present invention.
Figure 4:
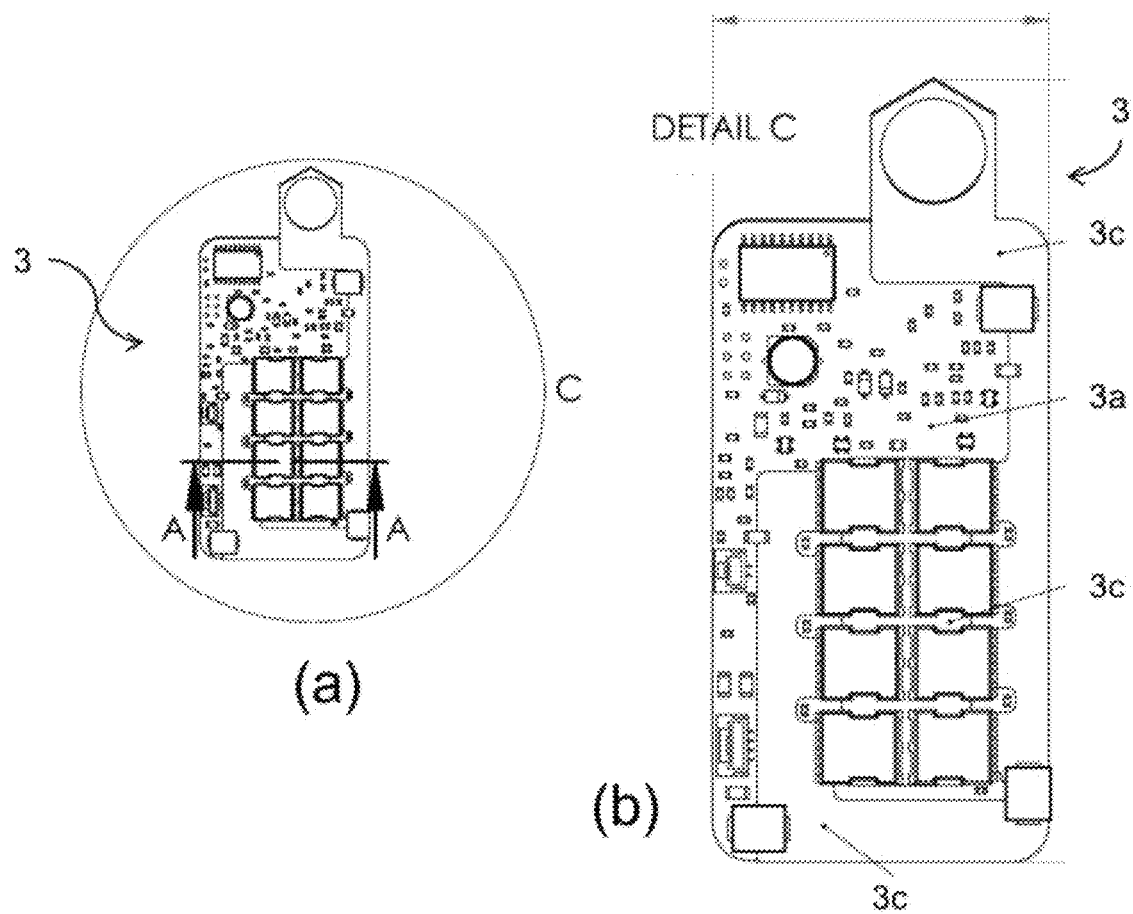
FIG. 4 shows in view (a) a top view onto a separating device of the energy storage device according to the invention and in view (b) an enlarged detail C of view (a).
Figure 5:
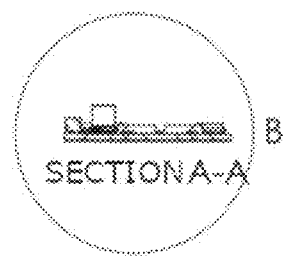
FIG. 5 shows in view (a) a sectional view of the separating device according to FIG. 4 along the line A-A from FIG. 4a and in view (b) an enlarged detail B of view (a).
Figure 5:
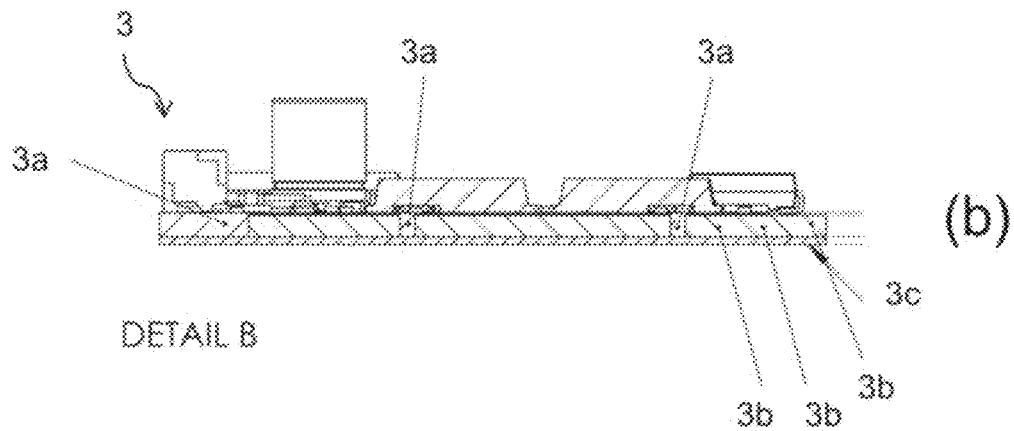

FIG. 3 shows an energy storage device 1 with an automotive alternator connected thereto as power source 5. Provided between energy storage device 1 and alternator 24 is a separating device 3 which is configured to separate energy storage device 1 from power source 5, e.g. the alternator, and/or a power receiver 7, e.g. a starter, presently not shown. Separating device 3 is configured to interact with data generating unit 4 and/or via data transmitting unit 6 with data input/output device 9. Depending on received and/or transmitted data, separating device 3 can separate energy storage element 2 from power source 5 and/or power receiver 7. Separating device 3 can be arranged as an external peripheral or within casing 8 of energy storage device 1.

Furthermore, a device 28 for generating a voltage drop can be arranged between energy storage device 1 and alternator 5 and preferably be configured as a diode. Such a device 28 can protect energy storage elements 2 from excessive feeding by alternator 5, in particular if alternator 5 provides a permanently excessive feed.

Finally, a device 30 for detecting electrical currents can be arranged between energy storage device 1 and alternator 5 and allow conclusions to be drawn about the charging capacity. Device 28 and/or device 30 can both be formed as part of data generating unit 4 and can be arranged within casing 8 Device 28 and/or device 30 can also be configured as external peripherals.

An energy storage device 1 described above can be used in a particularly advantageous manner as a starter battery for motor sports. The at least one energy storage element 2 can be monitored and/or inspected with little effort using an energy storage device 1 configured in this manner. With the data transmission between data generating unit 4 and data input/output device 9 via data transmitting unit 6, the monitoring and/or inspecting functionality can also be expanded with little effort, can in particular be individually adapted to the respective case of application. Since the alternator in the automotive sector is controlled differently (looped through/not looped through), a separate positive terminal for relevant vehicle peripherals (e.g. gasoline pump or ECU) must be provided for specific applications and can be located within or outside the casing and be switched wirelessly or via a wired signal.

Figure 6:
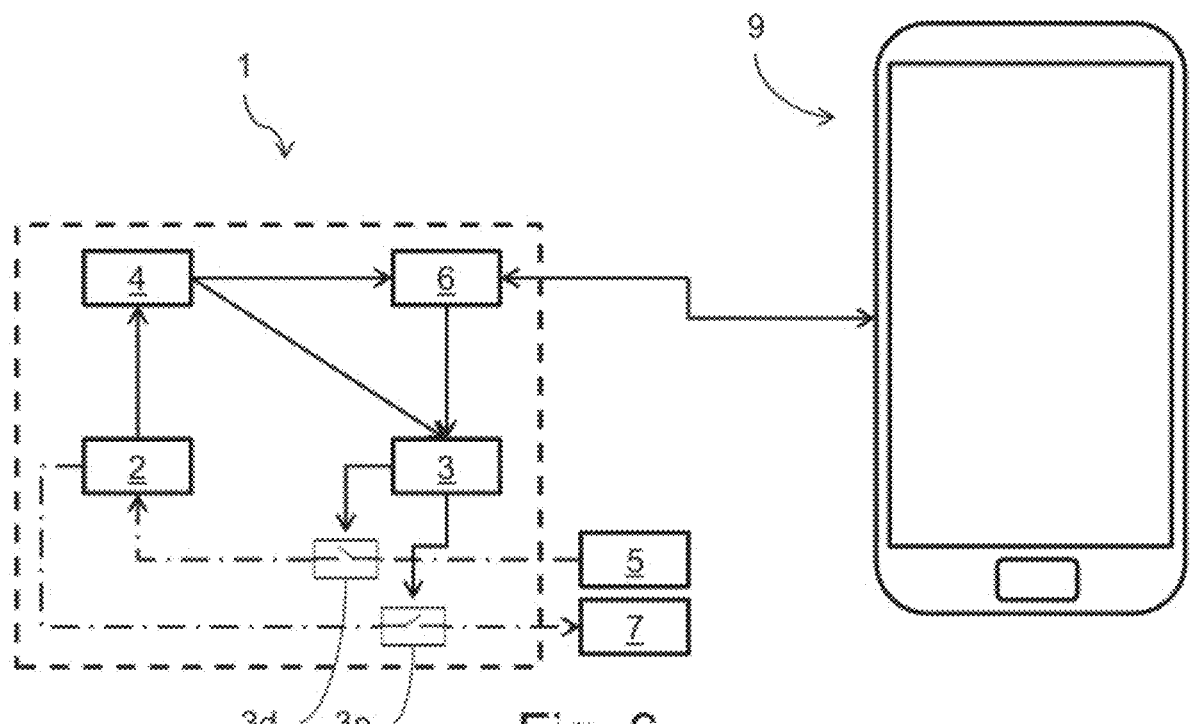
FIG. 6 shows a schematic diagram of an energy storage device according to one embodiment of the present invention.

FIG. 6 schematically shows the structure and the mode of operation of energy storage device 1. The components of energy storage device 1 are represented within a dashed rectangle by rectangular symbols with corresponding reference symbols. The data streams between the components of energy storage device 1 and data input/output device 9 are symbolized by arrows with solid lines. Arrows with dash-dotted lines show the electrically conductive connections between energy storage element 2 and power source 5, e.g. the alternator of a vehicle or power receiver 7, such as the starter of the vehicle. Integrated into the connection between energy storage element 2 and power source 5 is a switch 3d which is configured as a high-performance MOSFET-based switch and can be actuated as part of separating device 3 by the control electronics in order to selectively separate or establish the connection between energy storage element 2 and power source 5. Also located between energy storage element 2 and power receiver 7 is a switch 3e which is configured as a high-performance MOSFET-based switch and can be actuated as part of separating device 3 by the control electronics in order to selectively separate or establish the connection between energy storage element 2 and power receiver 7. Corresponding switches 3d, 3e are preferably located between each energy storage cell or group/series of energy storage cells and power source 5 or power receiver 7, respectively.

In addition to intelligent control electronics with integrated sensors, energy storage device 1 according to the invention therefore also comprises an innovative load switch in the form of separating device 3, which makes it possible via switches 3d, 3e to individually actively separate the employed battery cells in the charging and discharging direction and also to measure the effective current.

This circuit, referred to as the battery management system (BMS), is configured in particular for an energy storage element 2 that is configured as a starter battery with the aim of never operating the employed battery cells outside the working range specified. For this purpose, operating parameters such as the voltage, current, temperature of energy storage device 1 or individual energy storage cells or groups/series of energy storage cells, as well as the mechanical load, the gas atmosphere or the location of energy storage device 1 are acquired by data generating unit 4 and converted into corresponding digital data. In addition, all limit values can be freely programmed so that the separating device can be adapted to the specific case of application or behavior of the vehicle and its battery control. Furthermore, the data determined from the limit values measured during operation can be used to adaptively program the separating device or to self-learn. In addition, the limit values about vehicle-specific characteristic curves can be subsequently loaded, so that it can be ensured that the separating device corresponds to the existing battery control. Loading the data can be done e.g. via CAN/LIN bus or wirelessly via Bluetooth using a smartphone/tablet.

This "intelligent car battery" comprises the following components/features:

1.) Load Switch or Separating Device 3

Separating device 3 is an electronic high-performance MOSFET-based switch which is configured for low voltages in the range from 9V to 16V and high currents up to 200 A continuous current and 1200 A peak.

In order to keep the heat development as low as possible, the power flows are transmitted directly via shaped members 3b in the form of punched and bent parts made of copper or brass, without these having to be passed through a normal circuit board 3a. The circuit there consists of a combination of a normal double-layer circuit board 3a on which the control electronics is implemented and several shaped members 3b which transmit the high current and connect the electronic switches (MOSFETs). With this combination, special and expensive circuit board technology, e.g. thick film circuit boards or copper inlays, can be dispensed with and extremely powerful switches can be implemented in an inexpensive, small and easy manner.

2.) Remote Maintenance of Energy Storage Device 1:

In an advantageous embodiment, energy storage device 1 provides the user with the option of reading out all sensor data acquired via data generating unit 4 in real time or the history via data transmitting unit 6 in the form of e.g. a wireless LAN/Bluetooth interface by way of a user program ("app") installed on data input/output device 9 (e.g. mobile terminal device such as a smartphone or tablet) and, if necessary, displaying it graphically.

This now gives rise to the option of performing remote maintenance for all products in the field in order to effectively recognize the following scenarios and to initiate countermeasures or e.g. to inform the user by SMS before damage occurs:

- incorrect use of energy storage device 1 (inter alia incorrect charger)
- faulty vehicle periphery (inter alia defective alternator regulator)
- poor installation situation of energy storage device 1 (inter alia too close to the engine or exhaust system)
- faulty battery cells (voltage drop or delta of the individual cells)

In addition, energy storage device 1 is also able to autonomously block itself permanently (defective cells) or temporarily (wrong charger) and send a corresponding error code to the user's app.

If, for example, data generating unit 4 detects via the acquired operating parameters of energy storage device 1 an error of entire energy storage device 1 or generates a corresponding data signal, respectively, a connection between energy storage element 2 and a power source 5 and/or a connection between energy storage element 2 and a power receiver 7 is/are selectively separated via separating device 3. With this "intelligent control", any action by the user or any interaction of energy storage device 1 with data input/output device 9 is not necessary. However, corresponding information can be output to data input/output device 9 via data transmitting unit 6.

If, for example, data generating unit 4 detects, via the acquired operating parameters of energy storage device 1, defective energy storage cells or generates a corresponding data signal, respectively, a connection between the defective energy storage cell or cells and a power source 5 and/or a connection between the defective energy storage cell or cells and a power receiver 7 is/are selectively separated via separating device 3, whereas a connection between the functional energy storage cell or cells and power source 5 and/or a connection between the functional energy storage cell or cells and power receiver 7 is established or upheld. With this "intelligent control" as well, any action by the user or any interaction of energy storage device 1 with data input/output device 9 is not necessary, although of course corresponding information can also be output to data input/output device 9.

All energy storage devices 1 can also be read out via the interface and beyond that also again activated/deactivated within a radius of approx. 10 m, for example by BLE—Bluetooth Low Energy—depending on the type of Bluetooth performance, which can be advantageous e.g. when reading out several applications or vehicles, respectively 3.) Theft Function Via Wireless Interface In this country, numerous vehicles are now stolen entirely without tools using so-called sniffers in that the code of the radio remote control is co-scanned or simply broken open and started by someone else.

For example, a password-protected "immobilizer" can be activated through the data transmitting unit 6 via the data input/output device 9, through which the consumers/sensors of the vehicle are permanently supplied with energy when stationary, but blocked during the starting process. The "immobilizer" can selectively be activated or deactivated.

4.) Protection Function in Cold/Heat

In contrast to conventional automotive starter batteries, lithium-iron batteries generate their own heat field under load, so that they start reliably even at low temperatures if energy is respectively extracted shortly before the starting process. This energy extraction can take place via consumers in the vehicle electrical system or internal discharge by resistors.

With the approach described above, energy storage device 1 can be activated already prior to (via app) or when the vehicle is opened (by voltage peak at the CB), so that the full starting power is always available shortly after boarding, even in the winter, until then, for example, permanently blocked for high energy consumption (starting process).

As a result, the battery cells are loaded significantly less at low temperatures (<10° C.) than without previous heating, which increases the service life/number of cycles.

Heat or overheating can likewise be effectively protected or shut down [sic], which prevents a "thermal runaway" (common case of application of a BMS for storage batteries).

5.) Protection Function in Case of Overload

The battery cells can be actively protected against short-circuit by an integrated fuse (common case of application of a BMS for storage batteries).

In the embodiment of energy storage device 1 described, however, the current measurement is used for diagnosis purposes in order to additionally protect the battery cells against overload:

a.) Continuous current too high (too many consumers or damage to the alternator)→separation via increased measured value at the temperature sensor b.) Starting current too high (starter battery undersized or starter defective/seized)→separation via increased measured value during current measurement 6.) Integrated Current Measurement The current can be recorded approximately in real time in both directions (in the charge direction or from power source 5 to energy storage element 2, respectively, and in the discharge direction or from energy storage element 2 to the power receiver 7, respectively) by way of the voltage drop at the circuits (MOSFETs) or, more precisely, by way of an additional measuring resistor (generally "shunt"), which in turn enables the inspection of the state of charge of the battery cells at any time via data input/output device 9. The exact state of charge of the battery cells (commonly "SOC") determined in this manner provides information about the remaining capacity. Furthermore, the presently extracted nominal current can further be determined exactly via a measuring shunt as well as the quiescent current of the consumer/vehicle peripherals active when stationary, whereby a sufficiently precise running time remaining or service life of the battery cells can be determined and output via the data transmitting unit.

7.) Interconnecting Energy Storage Devices 1 Among Each Other

The existing units of energy storage device 1 are configured for 12V or 16V systems, but can also be operated in series.

For all units to operate in a network at the same level, they can actively communicate among each other via respective data transmitting units 6 and thus effectively identify errors.

In a further application e.g. the starter battery of a camper van can communicate with energy storage device 1 and thus provide reserves as intelligently as possible.

LIST OF REFERENCE NUMERALS 1 energy storage device
2 energy storage element 3 separating device
3a circuit board
3b shaped member
3c base plate
3d switch (between energy storage element and power source)
3e switch (between energy storage element and power receiver)
4 data generating unit
5 power source
6 data transmitting unit
7 power receiver
8 casing
9 data input/output device
10 cover
12 base plate
14 foam
16 cable arrangement
18 terminals
20 pressure compensation valve
22 symbol
28 device for generating a voltage drop
30 device for detecting electrical currents

The invention claimed is:

1. An energy storage device, the energy storage device comprising: at least one energy storage element, a data generating unit for acquiring operating parameters of said energy storage device and generating corresponding data, at least one separating device for reversibly separating an electrically conductive connection between said energy storage element and a power source and/or an electrically conductive connection between said energy storage element and a power receiver; and a data transmitting unit for transmitting data between said data generating unit and a data input/output device and between said data input/output device and said separating device, where said separating device is actuated depending on data which is transmitted from said data generating unit and/or said data transmitting unit to said separating device, wherein said energy storage element is accommodated in a casing, where pressure equalization in said casing is realized by way of a membrane integrated into a casing cover, where said membrane is configured such that it opens or disintegrates at a temperature above 100° C. and thus additionally increases the air throughput.

2. The energy storage device according to claim 1, wherein said energy storage device comprises at least one of the following features:
   a. Said energy storage device has a weight in the range from 0.5 to 5 kg, preferably in the range from 1 to 3 kg, preferentially 1.1 kg, 1.9 kg or 2.6 kg;
   b. Said energy storage device generates a maximum discharge current in the range from 200 to 2000 A, preferably in the range from 400 to 2000 A, preferentially 450 A, 750 A or 1050 A;
   c. Said energy storage device has a capacity in the range from 30 to 1000 Wh, preferably in the range from 30 to 250 Wh, preferentially 99 Wh, 165 Wh or 231 Wh;
   d. Said energy storage device has a nominal voltage in the range from 5 to 20 V, preferably in the range from 9 to 16 V, preferentially 13.2 V; or,
   e. Said energy storage device has a maximum voltage in the range from 5 to 20 V, preferably in the range from 9 to 16 V, preferentially 15.2 V.

3. The energy storage device according to claim 1, wherein said energy storage element comprises at least one of the following features:
   a. Said energy storage element comprises one or more energy storage cells, preferably a battery cell, preferentially a secondary battery or rechargeable battery cell or a cup cell;
   b. Said energy storage element comprises one or more lithium battery cells;
   c. Said energy storage element comprises one or more lithium iron phosphate battery cells;
   d. Said energy storage element is formed as a starter battery, preferably for feeding a starter of an internal combustion engine;
   e. Said energy storage element is formed as a starter battery for motor vehicles, in particular for the use in motor sports vehicles;
   f. Said energy storage element or at least one energy storage cell is formed to be cylindrical, cuboid or cube-shaped, where the positive terminal and the negative terminal are preferably formed at different ends of said energy storage element;
   g. Said energy storage element comprises an operating temperature range from −30° C. to +60° C., preferably from 0° C. to +40° C., preferentially from +15° C. to +25° C.;
   h. Said energy storage element comprises a plurality of energy storage cells which are preferably connected in parallel and/or in series to one another;
   i. Said energy storage element comprises a plurality of energy storage cells which are connected in series to form a cell pack;
   j. Said energy storage element comprises a plurality of cell packs with energy storage cells connected in series, where said cell packs are connected in parallel to one another;
   k. Said energy storage element comprises exactly 12 energy storage cells, where 4 cells are preferably connected in series to form a cell pack and further preferably 3 cell packs are connected in parallel;
   l. Said energy storage element comprises exactly 20 energy storage cells, where 4 cells are preferably connected in series to form a cell pack and further preferably 5 cell packs are connected in parallel; or,
   m. Said energy storage element comprises exactly 28 energy storage cells, where 4 cells are preferably connected in series to form a cell pack and further preferably 7 cell packs are connected in parallel.

4. The energy storage device according to claim 1, wherein said separating device comprises at least one of the following features:
   a. Said separating device comprises at least one electronic switch for reversibly separating an electrically conductive connection between said energy storage element and a power source and/or an electrically conductive connection between said energy storage element and a power receiver, preferably at least one high-performance MOSFET-based switch, preferably at least one separate electronic switch for each energy storage cell or each group/series of energy storage cells of said energy storage element, particularly preferably one respective electronic switch for reversibly separating said respective energy storage cell or said respective group/series of energy storage cells from a power source and one electronic switch for reversibly separating said respective energy storage cell or said respective group/series of energy storage cells from a power receiver;
   b. Said separating device comprises a circuit board on which control electronics are implemented;

c. Said separating device comprises at least one electrically conductive shaped member, in particular a punched and/or bent part, in particular made of copper or brass, for conducting a current to and/or from said energy storage element, preferably at least one electrically conductive shaped member for each energy storage cell or each group/series of energy storage cells of said energy storage element, in particular one respective electrically conductive shaped member for conducting a current from an electronic switch according to a feature of said respective energy storage cell or said respective group/series of energy storage cells and one respective electrically conductive shaped member for conducting a current from said respective energy storage cell or said respective group/series of energy storage cells to an electronic switch according to feature a;

d. Said separating device comprises a base plate, preferably made of fiber-reinforced plastic, on which said circuit board according to feature b and the at least one shaped member according to feature c are arranged together;

e. At least one, several or each switch(es) according to feature a can be actuated depending on the first data signal and/or the second data signal and/or the third data signal and/or the fourth data signal of said data generating unit, where said respective electronic switch and said respective data signal preferably pertain to the same energy storage cell or the same group/series of energy storage cells of said energy storage element;

f. At least one, several or each switch(es) according to feature a can be actuated depending on a data signal transmitted from said data transmitting unit to said separating device;

g. At least one, several or each switch(es) according to feature a can be actuated depending on a data signal transmitted from said data display unit to said separating device;

h. Said separating device is arranged on the cover of a casing of said energy storage device or is arranged in a corresponding receptacle in said cover of said casing of said energy storage device;

i. Said separating device is configured to interrupt an electrically conductive connection between said energy storage element and a power receiver, in particular in the form of a starter for an internal combustion engine, when a data signal is received from said data generating unit which indicates an excessively low temperature of said energy storage element or an energy storage cell or a group/series of energy storage cells of said energy storage element and to establish an electrically conductive connection between said energy storage element or said energy storage cell or said group/series of energy storage cells and another power receiver;

j. Said separating device is configured to establish an electrically conductive connection between said energy storage element and a power receiver, in particular in the form of a starter for an internal combustion engine, when a data signal is received from said data generating unit which indicates the correct temperature of said energy storage element or an energy storage cell or a group/series of energy storage cells of said energy storage element;

k. Said separating device is configured to interrupt an electrically conductive connection between said energy storage element and a power receiver, in particular in the form of a starter for an internal combustion engine, when a first data signal is received from said data transmitting unit, and to establish it when a second data signal is received from said data transmitting unit; or, l. Said separating device is configured to restore the electrically conductive connection after a separation of the electrically conductive connection when a data signal is received from said data transmitting unit or when a data signal is received which indicates the connection of a charger or the application of an initial voltage between the terminals.

5. The energy storage device according to claim 1, wherein said data generating unit comprises at least one of the following features:

a. Said data generating unit is configured to acquire at least one of the following operating parameters of said energy storage device and to generate corresponding data:
   i. The electrical voltage of said energy storage element, preferably the electrical voltage of an individual energy storage cell or a group/series of energy storage cells of said energy storage element, preferably the electrical voltage of each energy storage cell or each group/series of energy storage cells of said energy storage element;
   ii. The electrical current of said energy storage element, preferably the electrical current of an individual energy storage cell or a group/series of energy storage cells of said energy storage element, preferably the electrical current of each energy storage cell or each group/series of energy storage cells of said energy storage element;
   iii. The temperature of said energy storage element, preferably the temperature of an individual energy storage cell or a group/series of energy storage cells of said energy storage element, preferably the temperature of each energy storage cell or each group/series of energy storage cells of said energy storage element;
   iv. The pressure within or in the environment of said energy storage device, in particular within a casing of said energy storage device;
   V. The moisture within or in the environment of said energy storage device, in particular within a casing of said energy storage device;
   vi. The gas composition within or in the environment of said energy storage device, in particular within a casing of said energy storage device;
   vii. Acceleration of said energy storage device; or,
   viii. Location of said energy storage device;

b. Said data generating unit is configured to generate a first data signal if at least one of the operating parameters according to feature a lies within a corresponding range of operating parameters, where the corresponding range of operating parameters is preferably adjustable, preferably by way of said data input/output device;

c. Said data generating unit is configured to generate a second data signal if at least one of the operating parameters according to feature a lies outside a corresponding range of operating parameters, where the corresponding range of operating parameters is preferably adjustable, preferably by way of said data input/output device;

d. Said data generating unit is configured to generate a third data signal if at least one of the operating parameters according to feature a lies below a corresponding range of operating parameters, where the corresponding range of operating parameters is preferably adjustable, preferably by way of said data input/output device;
e. Said data generating unit is configured to generate a fourth data signal if at least one of the operating parameters according to feature a lies above a corresponding range of operating parameters, where the corresponding range of operating parameters is preferably adjustable, preferably by way of said data input/output device;
f. Said data generating unit is configured to monitor the operating state of said energy storage element, in particular, for real-time monitoring;
g. Said data generating unit is configured to inspect individual states of said energy storage element, preferably to inspect a non-operating state, the delivery state, a state for diagnostic purposes and/or a state in which said energy storage device is separated from a power source and/or a power receiver;
h. Said data generating unit is configured to detect fault states of said energy storage element, is preferably configured to acquire critical voltage, current, temperature, pressure, moisture and/or gas values, further preferably to acquire respective maximum and/or minimum values;
i. Said data generating unit is configured to store acquired data, in particular acquired electrical voltages, currents, temperatures, pressures, moisture values, gas values, fault conditions, maximum and/or minimum values;
j. Said data generating unit is configured to transmit acquired and/or stored data by way of said communication device;
k. Said data generating unit comprises a sensor for detecting the electrical voltage of said energy storage element and/or a device for detecting electrical currents, preferably a current sensor or shunt, and/or a temperature sensor for detecting the temperature of said energy storage element and/or a pressure sensor and/or a moisture sensor and/or a gas sensor, preferably for determining the change in the cell chemistry of said energy storage element and/or a location sensor, preferably a GPS sensor;
l. Said data generating unit comprises a memory unit for storing acquired data;
m Said data generating unit comprises a data processing device for processing acquired and/or stored data;
n. Said data generating unit is configured to transmit acquired and/or stored data to a vehicle control device;
o. Said data generating unit is configured to transmit acquired and/or stored data by way of said communication device to a stationary or mobile terminal, in particular a smartphone, where information based on the data can be displayed, preferably graphically and/or in text form, in a user program installed on said terminal; or,
p. Said data generating unit is configured to transmit acquired and/or stored data to a stationary or mobile monitoring system, preferably having a display.

6. The energy storage device according to claim 1, wherein said data transmitting unit comprises at least one of the following features:

a. Said data transmitting unit is configured for contactless signal and/or energy transmission;
b. Said data transmitting unit is configured for contactless communication, preferably for contactless data transmission;
c. Said data transmitting unit is configured to send and/or receive data;
d. Said data transmitting unit is configured to transmit data by way of radio technology and/or light waves;
e. Said data transmitting unit is configured to transmit data by way of RFID technology, near field communication (NFC), Bluetooth and/or wireless LAN;
f. Said data transmitting unit is configured as an antenna for near field communication (NFC), in particular as an NFC tag;
g. Said data transmitting unit is configured to transmit signals, data and/or energy by way of induction and/or magnetic coupling;
h. Said data transmitting unit is configured as a Reed switch;
i. Said data transmitting unit is configured for secure data exchange, in particular for cryptographically secured data exchange;
j. Said data transmitting unit is configured for active-passive and/or for active-active (peer-to-peer) communication;
k. Said data transmitting unit is integrated into the vehicle telemetry by way of the CAN/LIN interface and can thus be monitored and actively actuated via the vehicle's control device where necessary; or,
l. Said data transmitting unit is configured for communication via CAN/LIN, is integrated into the vehicle telemetry such that it can be monitored and actively actuated via the vehicle's control device where necessary.

7. The energy storage device according to claim 1, wherein said data generating unit and/or said data transmitting unit is/are also arranged within or on said casing.

8. The energy storage device according to claim 1, wherein said data generating unit is arranged between said energy storage element and a casing wall, preferably between said energy storage element and the one base of said casing and/or, where said casing comprises a cover, on the inner side of which said data transmitting unit is arranged.

9. The energy storage device according to claim 1, wherein said separating device is formed separately from said energy storage element and/or is arranged spaced from said energy storage element and/or where said separating device is integrated into said energy storage device, is preferably arranged within a casing of said energy storage device.

10. A control system of a motor vehicle comprising: an internal combustion engine, a starter and an energy storage device according to claim 1.

11. A monitoring system comprising: at least one energy storage device according to claim 1 and the data input/output device.

12. A method of controlling an energy storage for a motor vehicle according to claim 1.

* * * * *